United States Patent [19]
Herden et al.

[11] Patent Number: 6,040,204
[45] Date of Patent: Mar. 21, 2000

[54] METHOD OF STACKING CHIPS WITH A REMOVABLE CONNECTING LAYER

[75] Inventors: Werner Herden, Gerlingen; Johann Konrad, Tamm; Hans-Peter Jahn, Pliezhausen; Martin Knapp, Kirchentellinsfurt; Hans-Peter Fuessl; Ning Qu, both of Reutlingen, all of Germany

[73] Assignee: Robert Bosch GmbH, Stuttgart, Germany

[21] Appl. No.: 09/143,309

[22] Filed: Aug. 28, 1998

[30] Foreign Application Priority Data

Sep. 10, 1997 [DE] Germany .............................. 197 39 684

[51] Int. Cl.[7] .................................................. H01L 23/10
[52] U.S. Cl. ......................... 438/109; 438/458; 438/464; 257/686; 257/777
[58] Field of Search ..................................... 438/106, 109, 438/464, 975, 460, 458, 462, 465, 455; 257/686, 777; 29/830, 831

[56] References Cited

U.S. PATENT DOCUMENTS

| | | | |
|---|---|---|---|
| 5,135,878 | 8/1992 | Bartur | 438/109 |
| 5,199,163 | 4/1993 | Ehrenberg et al. | 29/830 |
| 5,412,865 | 5/1995 | Takaoka et al. | 29/830 |
| 5,480,503 | 1/1996 | Casey et al. | 29/830 |
| 5,547,906 | 8/1996 | Badehi | 438/109 |
| 5,635,766 | 6/1997 | Cain | 257/777 |
| 5,786,237 | 7/1998 | Cockerill et al. | 438/109 |
| 5,801,448 | 9/1998 | Ball | 257/777 |
| 5,824,177 | 10/1998 | Yoshihara et al. | 438/464 |
| 5,953,588 | 9/1999 | Camien et al. | 438/106 |

FOREIGN PATENT DOCUMENTS 44 17 164  6/1995  Germany .............................. 438/109

*Primary Examiner*—Donald L. Monin, Jr.
*Assistant Examiner*—Mike Dietrich
*Attorney, Agent, or Firm*—Kenyon & Kenyon

[57] ABSTRACT

A method for manufacturing chip stacks in which wafers are stacked one on top of the other. The wafer is provided with an adhesive foil on its bottom, and is subsequently cut into chips so that the adhesive foil remains intact and the chips adhering to the adhesive foil are stacked one on top of the other. A first layer of chips is reversibly attached to a baseplate, the adhesive foil is removed, the next layer of chips is attached to the bottom side of the chips already fastened to the baseplate, the adhesive foil is removed, and the last two steps are repeated until the desired number of chips is stacked one on top of the other.

30 Claims, 4 Drawing Sheets

METHOD OF STACKING CHIPS WITH A REMOVABLE CONNECTING LAYER

FIELD Of THE INVENTION

The present invention relates to a method for manufacturing chip stacks by stacking wafers one on top of the other.

BACKGROUND INFORMATION

A conventional method for manufacturing stack chips is described in German Patent Application No. 44 17 164, where wafers with planar high-voltage break-over diodes having an electrically conductive bonding layer in the form of a conductive adhesive on their top side are stacked directly one on top of the other. The adhesive is a prebakable adhesive allowing the individual wafers to be adjusted during stacking. After stacking, the adhesive may harden, so that the chips are electrically connected. The wafer stack is then perpendicularly cut into chip stacks. High-voltage break-over diodes that are bonded over their entire surface and are therefore mechanically strong are obtained. A disadvantage of this process is that it is relatively complex and therefore cost-intensive.

Furthermore, a manufacturing process for high-voltage diodes is known, where diffused silicon wafers are soldered together and then sawed apart into chip stacks. This process, however, is not well suited for all types of chips. For example, such a process is unsuitable for break-over diode planar chips.

SUMMARY OF THE INVENTION

The method according to the present invention is advantageous in that only simple, conventional standard processes (such as conductive adhesive screen-printing, wafer assembly on foil and sawing of wafers) are needed for preparing the wafers. Furthermore, the process according to the present invention is very simple and logical, and therefore inexpensive. With each individual process step the entire wafer block with approximately 10,000 chips is processed for manufacturing break-over diodes, for example.

In addition, a use of adhesive foils, whose adhesion can be reduced by deactivation (for example, by heating or irradiation with UV light) is advantageous. This allows an easy removal of the adhesive foils after each stacking.

Furthermore, the use of a prebakable conductive adhesive is advantageous when manufacturing break-over diode planar chips. This allows each wafer with all the chips to be imprinted at one time prior to cutting and prepared for the subsequent gluing process.

It is also advantageous that the selection of the baseplate allows numerous variations. In particular, use of a baseplate that provides a well-defined base position for the subsequent alignment of the chips is advantageous. By preserving the arrangement of the chips attached to the adhesive foil, all of the chips of a wafer are aligned in relation to this common base position. As a result, high accuracy of the overall dimensions of a finished stack is obtained.

DETAILED DESCRIPTION

Figure 1:
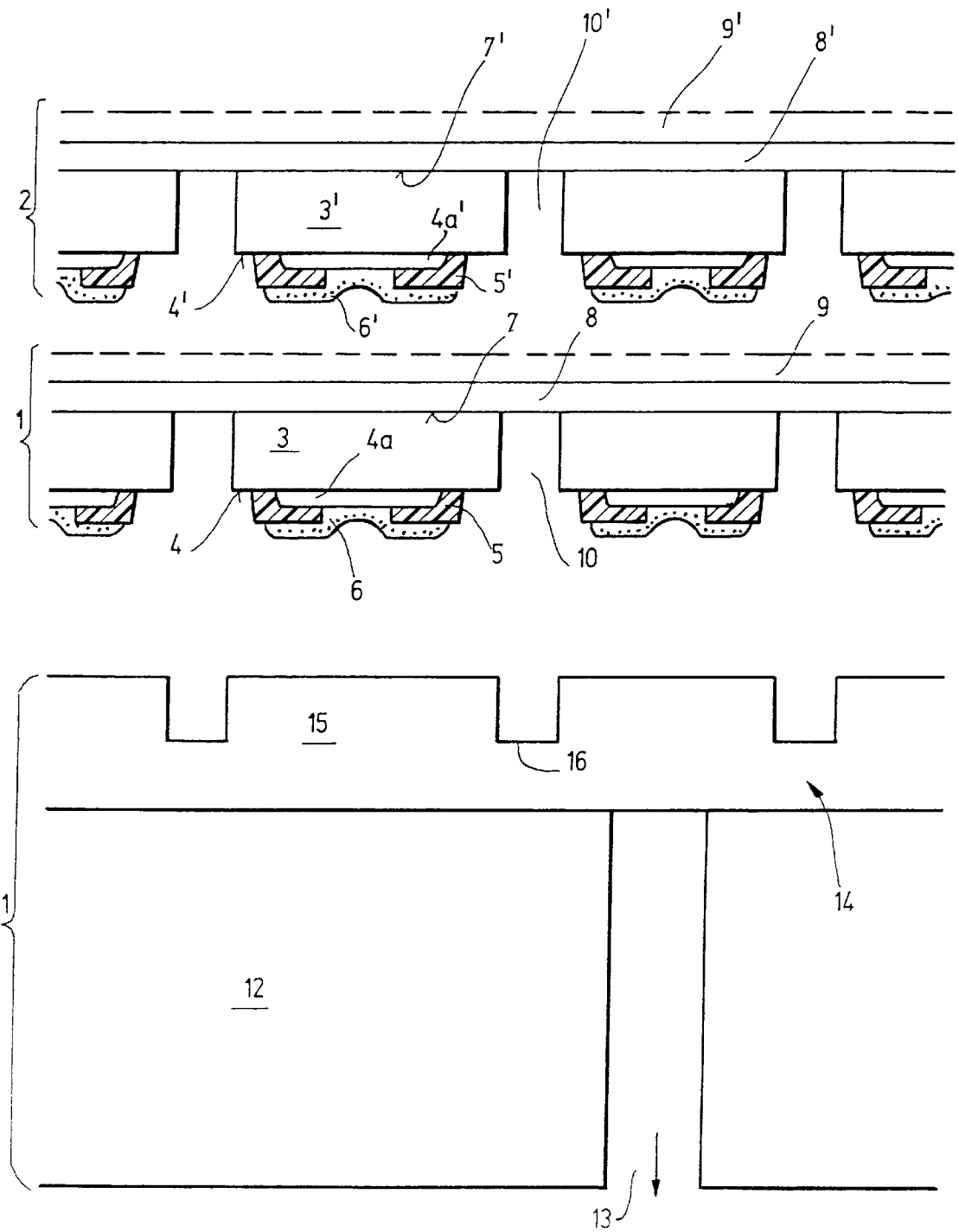
FIG. 1 shows a schematic exploded view of a first embodiment of a baseplate and first and second layers of chips according to the present invention.

The method according to the present invention is described below using the example of manufacturing break-over diode planar chips as described in German Patent Application No. 44 17 164, where (in general) 10 to 25 chips 3, 3' are stacked one on top of the other. The blocking voltage region of the break-over diodes appears on the chip surface and is covered by a polyimide layer 5, 5'. Polyimide layer 5, 5' defines, at the same time, an insulating gap between chips 3, 3'. The electric connection is established with a prebakable conductive adhesive 6, 6' between a window in the polyimide layer 5, 5' on the top side 4 of a layer 1 of chips 3 and the bottom side 7' of the next layer 2 of chips 3'. The conductive adhesive 6, 6' also serves as a mechanical bond. The details of this process are described in German Patent Application No. 44 17 164, the disclosure of which is incorporated herein by reference.

FIG. 1 schematically shows a process step where the individual layers 1, 2 of chips 3, 3' are stacked one on top of the other. Layers 1, 2 are produced as follows: A silicon wafer is provided, in a conventional manner, with break-over diodes by introducing the individual layers (p, n, p, n), for example, as dopants by diffusion. The resulting high-voltage break-over diode planar chips 3, 3' are provided, on their top surface 4, 4', with structure 4a, 4a', which is only indicated schematically with a polyimide layer 5, 5', leaving the cathode terminals and sawing grooves 10, 10' open. A special conductive adhesive 6, 6', e.g., a silver-containing prebakable polyimide conductive adhesive is then applied on polyimide structure 5, 5' of the top side 4, 4' of the wafer. This conductive adhesive 6, 6' can be applied using a screenprinting or stamping procedure. In this embodiment, a conductive adhesive 6, 6' with two curing stages at approximately 80° C. and over 200° C. is used. After its application, the conductive adhesive 6, 6'is prebaked in a first stage at approximately 80° C. This prebaking stage causes conductive adhesive 6, 6' on the wafer not to be affected by the subsequent processes (e.g., sawing, cleaning, adjusting). In the following step, a special adhesive foil 8, 8' is glued onto the bottom side 7, 7' of the wafers with chips 3, 3'. The adhesive force of this adhesive foil 8, 8' can be thermally de-activated. The adhesive force of adhesive foil 8, 8' is reduced during de-activation, i.e., heating to approximately 200° C.

In addition, the wafer is glued onto a supporting plate 9, 9'using adhesive foil 8, 8'. This, however, is not essential. Supporting plate 9, 9' is therefore indicated with a dashed line in FIG. 1. In the following step, chips 3, 3' on the wafer are separated from one another by sawing along sawing grooves 10, 10'. This is particularly simple if the wafer was previously glued on supporting plate 9, 9'. Thus the finished layers 1, 2 to be stacked on one another are obtained.

First layer 1 of chips 3 can be attached to a baseplate 11, which includes a supporting plate 12 and another wafer 14, as illustrated in FIG. 1. Supporting plate 12 has channels 13, through which a vacuum (indicated with an arrow) can be applied. First wafer 14 looks basically like the above-described wafer, i.e., it is provided with finished chips 15. Chips 15 are, however, not provided with conducting adhesive. Wafer 14 is only provided with a non-through saw groove. Therefore chips 15 are not completely separated from one another, but are connected via webs 16. By applying a vacuum along channels 13, wafer 14 is sucked and thus attached onto supporting plate 12.

The chip structure on wafer 14 defines a particular base position with which the subsequent layers 1, 2 of chips 3, 3'are to be aligned. First layer 1 is aligned with the base position defined by wafer 14 and positioned on chips 15 using a mechanical or optical centering process. Then, the entire block is heated, in this embodiment to approximately 180° C. Conducting adhesive 6 is thus cured to the point where chips 3 adhere to the bottom layer of chips 15.

Since adhesive foil 8 can be thermally de-activated, in this step the adhesive force of adhesive foil 8 is simultaneously reduced by heating so that it comes loose from chip layer 15, possibly together with supporting plate 9. Adhesive foil 8 and possibly supporting plate 9 are removed.

If the heating was still insufficient, it can be extended at approximately 180° C. until the adhesion of adhesive toil 8 has been sufficiently reduced.

However, when an adhesive foil is used that can be de-activated using UV light, it is irradiated with UV light after the heat treatment and then removed, possibly together with support plate 9.

In a subsequent step, chip layer 2 is attached to chips 3 of chip layer 1 as described previously.

The individual process steps are repeated until the desired number of chips 3 are stacked one on top of the other.

When the last layer of chips has been attached, the entire block receives the final curing. Then the block is detached from baseplate 12 by discontinuing the vacuum supply. Separate chip stacks are then obtained, which are only held together by the narrow web 16 between chips 15 of wafer 14. This web 16 can be removed by breaking, sawing or etching procedures. Thus, the prestructuring of baseplate 12 makes the last separation operation considerably easier by using a wafer 14 with sawing grooves.

Figure 2:
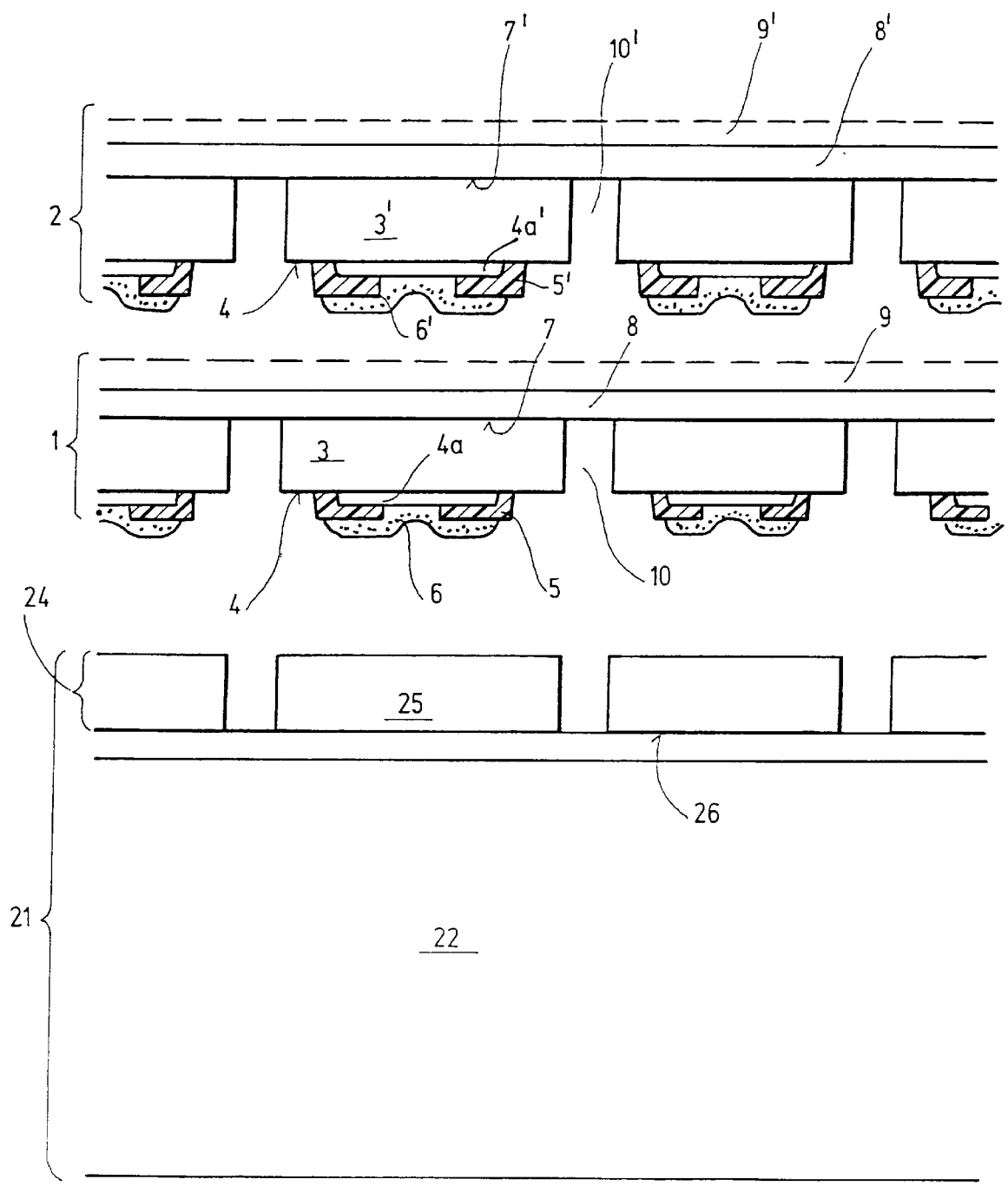
FIG. 2 shows a schematic exploded view of a second embodiment of the baseplate and the first and second layers of the chips.
Figure 3:
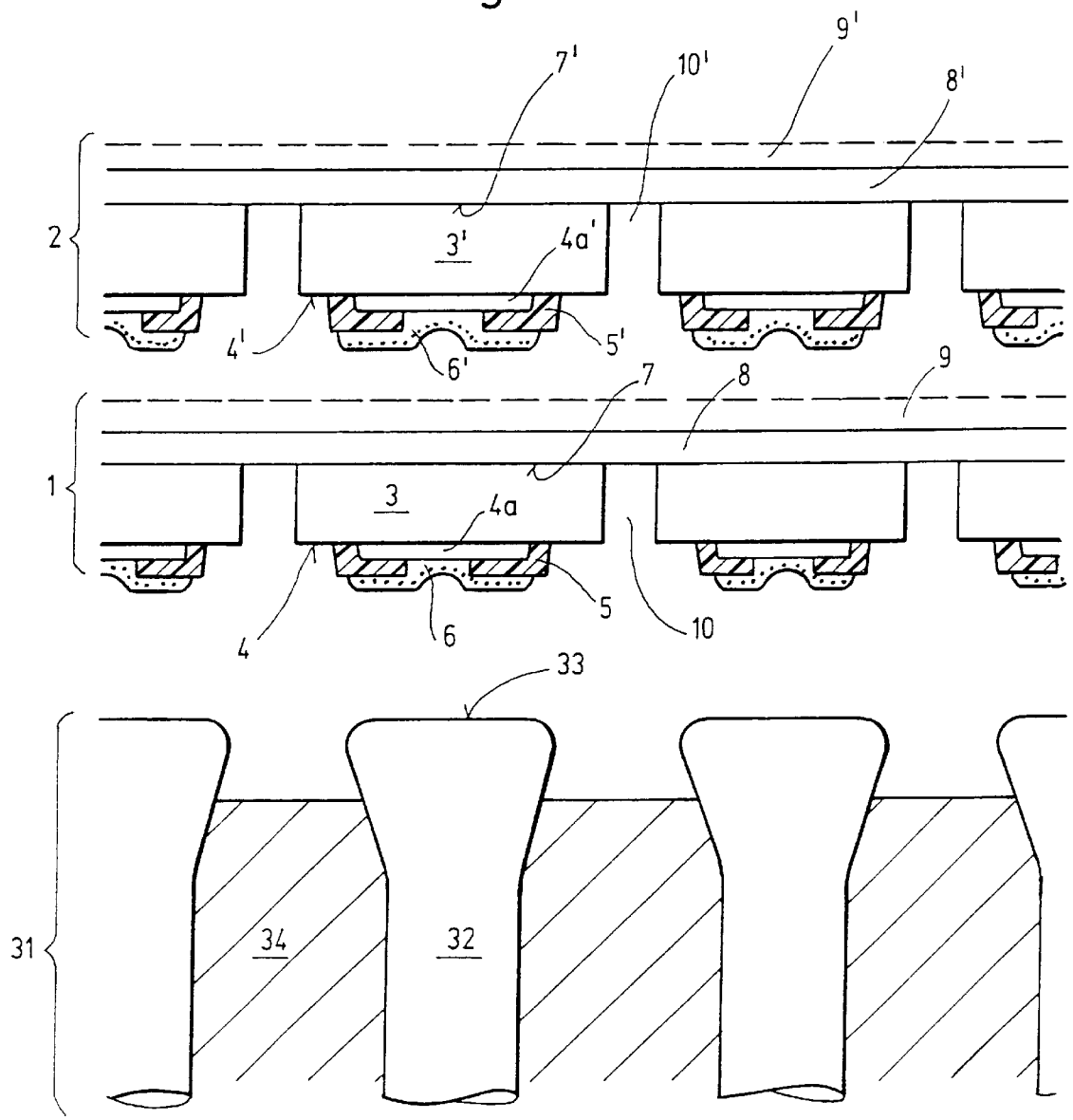
FIG. 3 shows a schematic exploded view of a third embodiment of the baseplate and the first and second layers of the chips.

FIGS. 2 and 3 show comparable views of second and third embodiments of the baseplate. Identical components are denoted by the same reference numbers.

FIG. 2 differs from FIG. 1 only by the fact that a through supporting plate 22 is used as baseplate 21, on which a first wafer 24 with chips 25 is attached. This wafer 24 also contains finished chips 25, but without conductive adhesive. Wafer 24 is reversibly attached onto supporting plate 22 after chips 25 have been manufactured, with an auxiliary material 26, such as an adhesive, a solder, or an adhesive foil comparable to adhesive foil 8, but which can be activated at higher temperatures or other wavelengths than those that activate adhesive foil 8. Subsequently, wafer 24 is sawed apart. The individual chips 25 are attached to supporting plate 22 using auxiliary material 26 thus defining the base position with which chip layers 1, 2 are aligned.

After completion of the stacking process, separate chip stacks are obtained, which are held together only by supporting plate 22 and auxiliary material 26. The finished chip stacks are separated by loosening auxiliary material 26, e.g., by melting the adhesive or the solder, or by activating the adhesive or adhesive foil using temperature or UV light.

FIG. 3 shows another baseplate 31 made of wide-end wires 32 in a matrix 34. Wide-end wires 32, i.e., their surfaces 33, define the base position with which the individual chip layers 1, 2 are aligned. Matrix 34 can be, e.g., a perforated mask or a high-melting plastic matrix. In the case of a perforated mask, wide-end wires 32 are also sucked in and attached by applying vacuum. After the completion of the stacking operation, the vacuum is discontinued and wide-end wires 32 are simply pulled out of the perforated mask.

Another activatable adhesive foil, comparable to adhesive foil 8, can also be used as the baseplate, which can be activated at higher temperatures or other wavelengths than those that activate adhesive foil 8.

Figure 4:
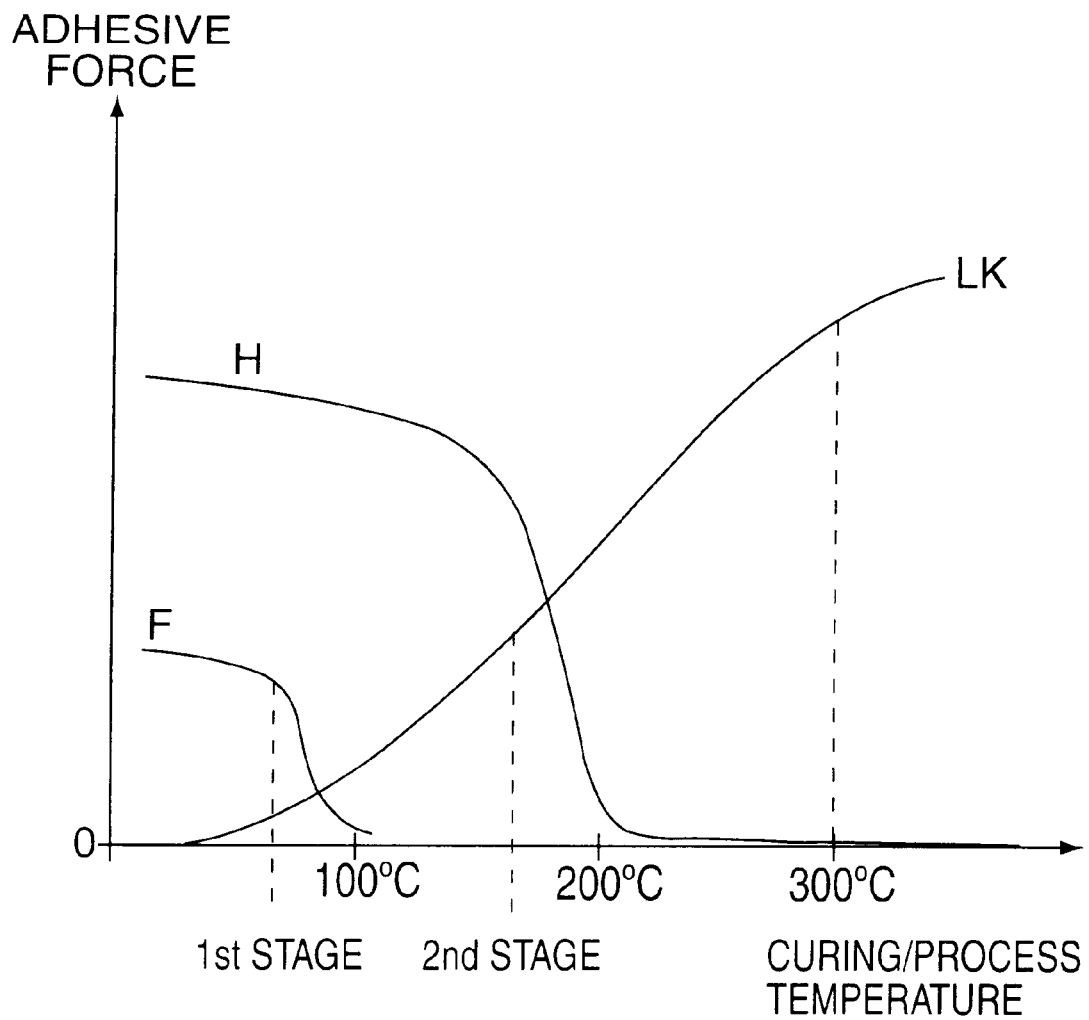
FIG. 4 shows a variation of an adhesive force of different adhesives as a function of temperature.

FIG. 4 shows a variation of the adhesive force of different adhesives as a function of temperature. Conductive adhesive LK is imprinted or stamped on the wafer and initially cured at up to approximately 80° C. (first stage). By heating to approximately 180° C., the conductive adhesive is cured and attached to the chip layer (second stage). The adhesive force of the conductive adhesive should therefore increase at an approximately constant rate when going through a process cycle between 100° C. and 300° C.

In the temperature range between 80° C. and 100° C., i.e., between the first and second stages, the adhesive force of adhesive foil F rapidly decreases. Thus, while the conductive adhesive is cured and the individual chip layers firmly adhere to one another, the adhesive foil becomes detached.

At temperatures reached while going through the individual process cycles, the adhesive force of auxiliary material H, with which the lowermost chip layer is attached to the supporting plate, is basically preserved. The adhesive force of auxiliary material H should only diminish noticeably at higher temperatures, e.g., at approximately 200° C., so that the chip stacks do not become detached before the entire stack is ultimately cured, i.e., at approximately 200° to 300° C.

The process can be controlled and optimized in a particularly inexpensive manner by adjusting the individual activation ranges of the different adhesives used.

What is claimed is:

1. A method for manufacturing a first number of chip stacks by stacking a second number of wafers, each of the wafers having a third number of chips, on top of one another, comprising the steps of:

(a) applying adhesive material to one side of a first wafer of the second number of wafers;

(b) applying adhesive foil to another side of the first wafer;

(c) separating the third number of chips of the first wafer, whereby the third number of chips are still connected by the adhesive foil;

(d) providing a base arrangement for positioning the adhesive material side of the first wafer on the base arrangement;

(e) removing the adhesive foil from the adhesive foil side of the first wafer, whereby the first wafer is adapted to become a mounting wafer;

(f) applying adhesive material to one side of a next wafer of the second number of wafers;

(g) applying adhesive foil to another side of the next wafer;

(h) separating the third number of chips of the next wafer;

(i) positioning the adhesive material side of the next wafer on the another side of the mounting wafer;

(j) removing the adhesive foil from the adhesive foil side of the next wafer, whereby the next wafer is adapted to become another mounting wafer; and (k) repeating steps (f) through (j) until all of the second number of wafers, each having the third number of separate chips, have been stacked to form the first number of separate chip stacks.

2. The method of claim 1, wherein the adhesive material is a conductive adhesive.

3. The method of claim 2, wherein the conductive adhesive is a prebakable conductive adhesive.

4. The method of claim 3, wherein the prebakable conductive adhesive is a prebakable polyimide conductive adhesive.

5. The method of claim 3, wherein the prebakable conductive adhesive contains silver.

6. The method of claim 3, wherein the prebakable conductive adhesive has a first curing stage and at least a second curing stage.

7. The method of claim 6, wherein the (a) and (f) steps of applying the adhesive material use a screen-printing procedure to apply the adhesive material.

8. The method of claim 6, wherein the (a) and (f) steps of applying the adhesive material use a stamping procedure to apply the adhesive material.

9. The method of claim 6, wherein the first curing stage involves heating the adhesive material to a temperature of about 80° C.

10. The method of claim 9, wherein the at least second curing stage involves heating the adhesive material to a temperature of about 180° C.

11. The method of claim 1, wherein the adhesive foil has a certain adhesiveness, and further wherein the (e) and (j) steps of removing the adhesive foil comprise a further step of at least reducing the adhesiveness of the adhesive foil by de-activating the adhesive foil.

12. The method of claim 11, wherein the step of de-activating the adhesive foil involves thermal de-activation of the adhesive foil.

13. The method of claim 12, wherein thermal de-activation involves heating the adhesive foil.

14. The method of claim 13, wherein the adhesive foil is heated to a temperature of about 180° C.

15. The method of claim 14, wherein the adhesive foil is further heated to a temperature of about 200° C.

16. The method of claim 11, wherein the step of de-activating the adhesive foil involves irradiating the adhesive foil with ultraviolet light.

17. The method of claim 1, wherein the base arrangement comprises a base plate.

18. The method of claim 17, wherein the base plate further comprises a supporting plate and another wafer having a chip structure having more than one chip.

19. The method of claim 18, wherein the chips of the another wafer are connected by a web.

20. The method of claim 19, wherein the supporting plate has at least one channel.

21. The method of claim 18, wherein the chip structure of the another wafer defines a base position, and further wherein the (d) and (i) positioning steps further comprise the step of aligning each of the second number of wafers with the base position.

22. The method of claim 21, wherein the aligning step involves using one of a mechanical centering process and an optical centering process.

23. The method of claim 19, further comprising the step of removing the web.

24. The method of claim 23, wherein the web is removed by using one of a breaking procedure, a sawing procedure and an etching procedure.

25. The method of claim 18, wherein the another wafer is reversibly attached to the support plate by an auxiliary material.

26. The method of claim 25, wherein the auxiliary material is one of an adhesive material, a solder and an adhesive foil.

27. The method of claim 17, wherein the base plate comprises more than one wide-end wire in a matrix arrangement.

28. The method of claim 27, wherein the matrix arrangement is one of a perforated mask and a plastic matrix.

29. The method of claim 17, wherein the base plate comprises another adhesive foil.

30. The method of claim 1, wherein the first number is the same as the third number.

* * * * *